(12) United States Patent
Feurle et al.

(10) Patent No.: US 6,615,289 B1
(45) Date of Patent: Sep. 2, 2003

(54) SEMICONDUCTOR CHIP CONFIGURATION AND METHOD OF CONTROLLING A SEMICONDUCTOR CHIP

(75) Inventors: Robert Feurle, Neubiberg (DE); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/437,956

(22) Filed: Nov. 10, 1999

(30) Foreign Application Priority Data

Nov. 11, 1998 (DE) .......................... 198 52 071

(51) Int. Cl.[7] .............................. G01R 31/28
(52) U.S. Cl. .................. 710/14; 714/724; 714/729; 371/14
(58) Field of Search ................ 714/724, 729; 371/22.1, 14; 710/14

(56) References Cited

U.S. PATENT DOCUMENTS 4,730,320 A * 3/1988 Hidaka et al. .............. 714/766
5,654,924 A * 8/1997 Suzuki et al. ........... 365/189.05
5,706,234 A * 1/1998 Pilch et al. ............. 365/189.01
6,094,736 A * 7/2000 Komoike ..................... 714/724
6,122,760 A * 9/2000 Grosch et al. ............... 714/724
6,324,657 B1 * 11/2001 Fister et al. ................... 714/42
6,327,681 B1 * 12/2001 Yamagishi et al. .......... 365/201

FOREIGN PATENT DOCUMENTS

EP        0 645 639 A1    3/1995

* cited by examiner

Primary Examiner—Jeffrey Gaffin
Assistant Examiner—Harold Kim
(74) Attorney, Agent, or Firm—Laurence A. Greenberg; Werner H. Stemer; Ralph E. Locher

(57) ABSTRACT

An integrated semiconductor chip is connected to external terminals with all of its data-carrying bonding pads. One of a plurality of possible data input/data output organizational forms is preset for a normal mode. Not all of the data-carrying bonding pads are used for the normal mode. During a test mode all of the data-carrying bonding pads are used. Thus, irrespective of the preset data input/data output organizational form, a uniform test mode requiring a minimal expenditure of time is possible. A method for controlling a semiconductor chip is also provided.

14 Claims, 3 Drawing Sheets

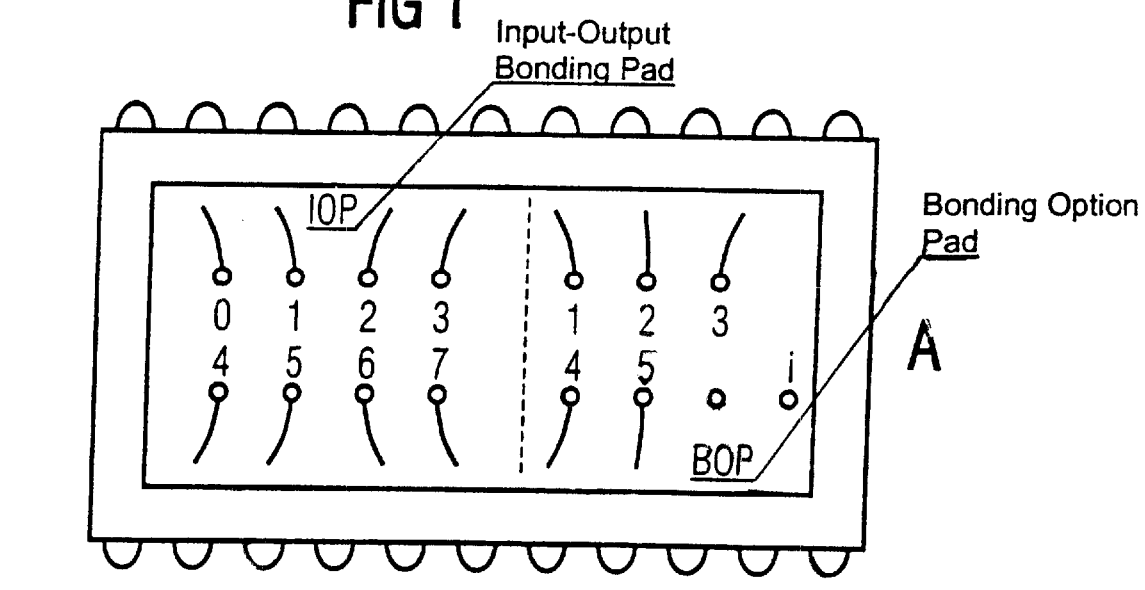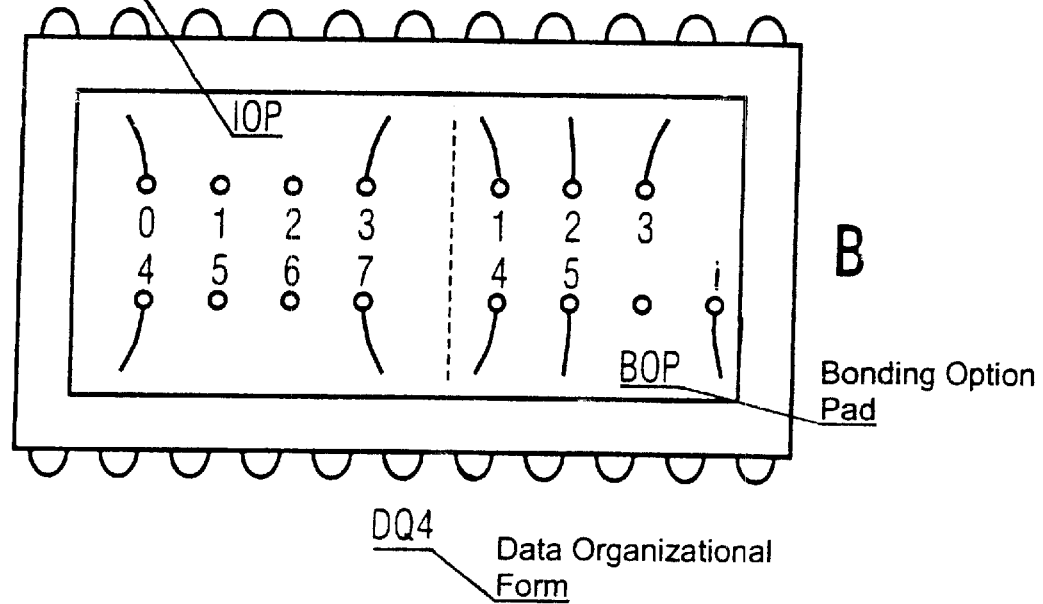

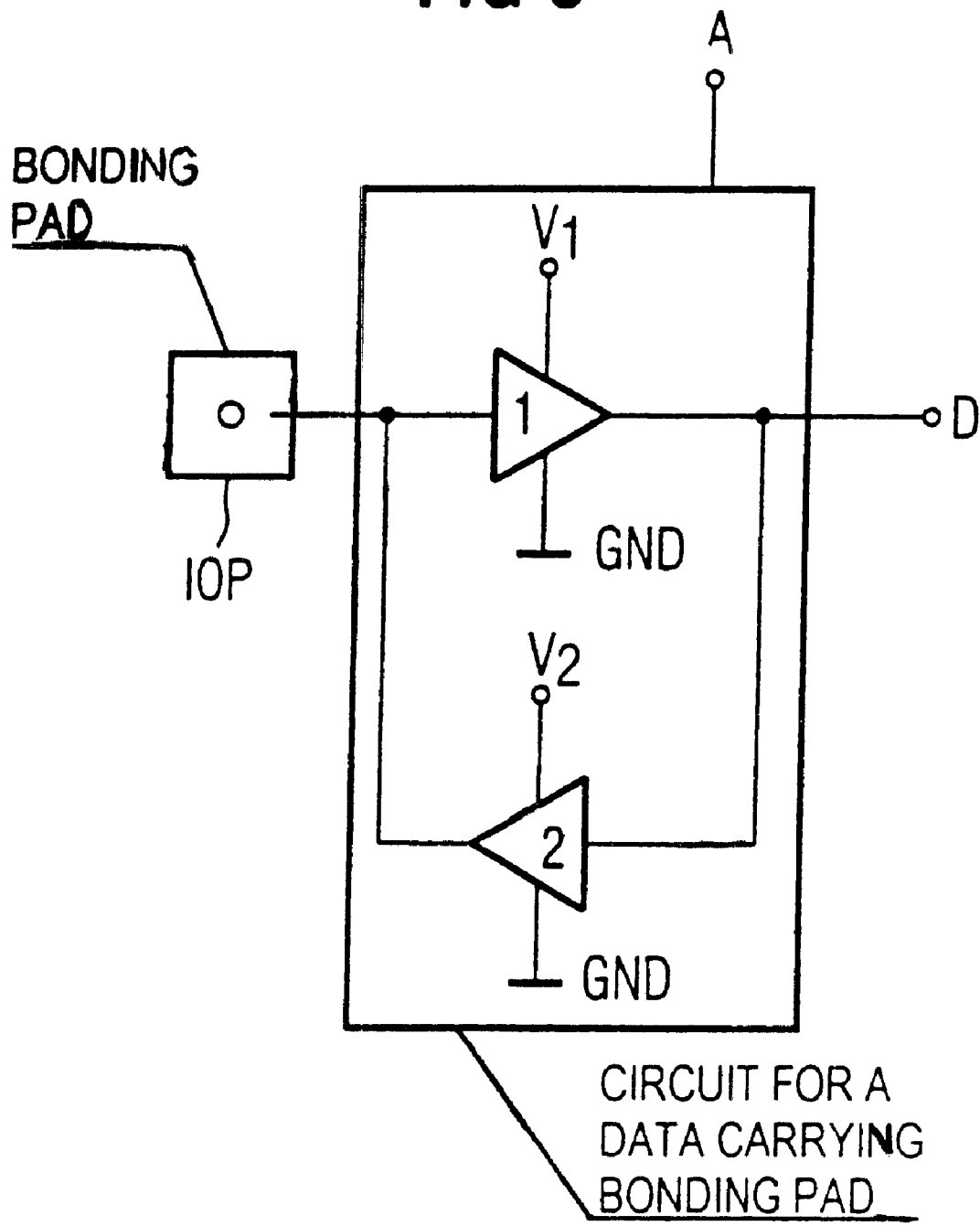

SEMICONDUCTOR CHIP CONFIGURATION AND METHOD OF CONTROLLING A SEMICONDUCTOR CHIP

BACKGROUND OF THE INVENTION

FIELD OF THE INVENTION

The present invention relates to an integrated semiconductor chip in which one of a plurality of possible data input/data output organizational forms is preset by externally wiring or interconnecting selected bonding pads to a voltage potential. Due to the preset data input/data output organizational form not all of the bonding pads for an exchange of input data and output data are required for a normal mode operation.

A semiconductor chip usually has internal terminals to one or more integrated circuits situated on the chip, which are referred to as so-called bonding pads. If the semiconductor chip is built into a housing of a semiconductor module, all or some of the bonding pads are provided with bonding wires which are electrically conductively connected to leads to external terminals of the semiconductor module. Such terminals may be, for example, terminals of data lines to external assemblies situated for example on a circuit board outside the module. A semiconductor chip can have different types of internal terminals. By way of example, a distinction is made between data-carrying bonding pads, which serve for the exchange of input and output data (for example via data lines mentioned above), and bonding pads, which, through the use of a type of interconnection or wiring that is to be selected, define for example an operating mode and/or a data input/data output organizational form of the chip. Such bonding pads are referred to as bonding option pads.

Due to the diversity of integrated semiconductor circuits with respect to products and applications, semiconductor chips are not developed and produced exclusively for individual applications, but rather are fundamentally configured for a plurality of applications and are tailored to individual applications by slight adaptations or changes. Thus, by way of example, a specific operating mode or one of a plurality of possible data input/data output organizational forms can be defined subsequently (after the production of the chip) by connecting a specific number or combination of the above-mentioned bonding option pads via an external terminal fixedly to a terminal for an external voltage potential. This connection between external terminal and bonding pad is permanently done by "bonding" (connection of a bonding wire to the respective bonding pad) and can no longer be reversed after the incorporation into the housing of the semiconductor module.

In order to be able to test a semiconductor chip after incorporation into a housing of a semiconductor module, it has so far been necessary to use test methods and test programs which are coordinated with or specific to the chip configuration respectively set through the use of bonding option pads. Depending on the diversity of applications of a semiconductor chip, thus a multiplicity of test methods and test programs results. This multiplicity of test methods and test programs may also vary in terms of the time requirement, depending on the chip configuration that has been set.

SUMMARY OF THE INVENTION

It is accordingly an object of the invention to provide an integrated semiconductor chip configuration which overcomes the above-mentioned disadvantages of the heretofore-known semiconductor chips of this general type and which allows to reduce the number of different variants of the test program and which further allows to reduce the expenditure of time for a test program for testing the semiconductor chip.

With the foregoing and other objects in view there is provided, in accordance with the invention, an integrated semiconductor chip configuration of the type having a semiconductor chip with a plurality of bonding pads for an exchange of input data and output data, the plurality of bonding pads including a first group of bonding pads being used for the exchange of input data and output data in a normal mode and including a second group of bonding pads not being used for the exchange of input data and output data in the normal mode, a data input/data output organizational form of a plurality of data input/data output organizational forms being preset for the normal mode, wherein the improvement includes that the first group and the second group of bonding pads for the exchange of input data and output data are connected to respective external terminals; and the semiconductor chip is operable in a test mode and has an altered data input/data output organizational form during the test mode, such that the second group of bonding pads are used in the test mode for the exchange of input data and output data.

In accordance with another feature of the invention, at least one bonding option pad is provided for presetting one of the plurality of data input/data output organizational forms for the normal mode, the at least one bonding option pad has an external interconnection and is fixedly connected with a bonding wire to a respective terminal for an external voltage potential. The semiconductor chip has the altered data input/data output organizational form during the test mode while the external interconnection is not changed.

In accordance with a further feature of the invention, the at least one bonding option pad has an internal interconnection for setting the altered data input/data output organizational form. The internal interconnection cancels an efficacy of the external interconnection of the at least one bonding option pad to the respective terminal for the external voltage potential.

In accordance with yet another feature of the invention, a control device for controlling operating modes is provided. The control device generates a control signal for setting the altered data input/data output organizational form.

In accordance with a yet a further feature of the invention, a circuit is connected to the at least one bonding option pad provided. The circuit includes a first transmission gate having a first field-effect transistor with a drain source path and a gate, having a second field-effect transistor with a drain source path and a gate, having a first coupling node and a second coupling node, the first field-effect transistor being connected to the second field-effect transistor at the first and the second coupling nodes with the drain source path of the first field-effect transistor being connected in parallel to the drain source path of the second field-effect transistor; a second transmission gate having a third field-effect transistor with a drain source path and a gate, having a fourth field-effect transistor with a drain source path and a gate, having a third coupling node and a fourth coupling node, the third field-effect transistor being connected to the fourth field-effect transistor at the third and the fourth coupling nodes with the drain source path of the third field-effect transistor being connected in parallel to the drain source path of the fourth field-effect transistor, the first field-effect transistor having a complementary channel type with respect to the second field-effect transistor, the third field-effect transistor having a complementary channel type with respect to the fourth field-effect transistor, the first coupling node being connected to a reference-ground potential of the semiconductor chip, and the second coupling node forming an output terminal for an output signal for setting one of the plurality of data input/data output organizational forms, the fourth coupling node being connected to the output terminal; an input terminal for receiving a control signal setting the altered data input/data output organizational form, the input terminal being connected to the gate of the first field-effect transistor and to the gate of the fourth field-effect transistor; a first inverter connecting the gate of the second field-effect transistor and the gate of the third field-effect transistor to the input terminal for receiving the control signal; a second inverter connecting the at least one bonding option pad to the third coupling node; and a resistor connected between the at least one bonding option pad and an internal supply potential of the semiconductor chip.

In accordance with a further feature of the invention, two driver stages connected to one of the bonding pads of the second group are provided. The driver stages are inactive during the normal mode and are enabled for an activation during the test mode.

With the objects of the invention in view there is also provided, a method of controlling an integrated semiconductor chip. The method includes the steps of providing a first plurality of bonding pads and a second plurality of bonding pads on a semiconductor chip for an exchange of input data and output data; presetting a data input/data output organizational form for a normal mode; using only the first plurality of bonding pads for the exchange of input data and output data in the normal mode based on the preset data input/data output organizational form; connecting the first plurality of bonding pads and the second plurality of bonding pads to external terminals; and selecting an altered data input/data output organizational form during a test mode, such that the second plurality of bonding pads is used in the test mode for the exchange of input data and output data.

In accordance with another mode of the invention, at least one bonding option pad for setting the data input/data output organizational form is provided; the data input/data output organizational form for the normal mode is preset by providing a fixed connection between the at least one bonding option pad and a respective terminal for an external voltage potential using a bonding wire; and the altered data input/data output organizational form is set for the test mode, without changing the fixed connection between the at least one bonding option pad and the respective terminal for the external voltage potential.

In accordance with a further mode of the invention, the altered data input/data output organizational form is set by an internal interconnection of the bonding option pads, the altered data input/data output organizational form canceling an efficacy of the fixed connection between the at least one bonding option pad and the respective terminal for the external voltage potential.

In accordance with a yet a further mode of the invention, the setting of the altered data input/data output organizational form is controlled with a control signal generated by a control device for controlling operating modes.

The object of the invention is achieved through the use of an integrated semiconductor chip with all of the data-carrying bonding pads connected or "bonded" to external terminals. An altered or modified data input/data output organizational form is configured, such that bonding pads that are not used in the normal mode are used in the test mode for the exchange of input data and output data.

In accordance with advantageous embodiments, in the case of a chip with a data input/data output organizational form that is preset through the use of bonding option pads, given an unchanged external wiring or interconnection of the bonding option pads, an altered data input/data output organizational form is set by an internal wiring or interconnection of the bonding option pads. A circuit provided for this purpose is controlled by a control device for controlling the operating mode. To ensure that no interfering influences are coupled in during the normal mode, unused data-carrying bonding pads are inactive in the normal mode.

Other features which are considered as characteristic for the invention are set forth in the appended claims.

Although the invention is illustrated and described herein as embodied in an integrated semiconductor chip with a data input/data output organizational form that is preset through the use of bonding pads, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a simplified diagrammatic top view of two semiconductor chips A and B having bonding pads which differ in terms of their data input/data output organizational form and the wiring of the bonding pads;

FIG. 3 is a schematic circuit diagram of a circuit for a data-carrying bonding pad with two driver stages for the exchange of input data and output data.

DESCRIPTION OF THE PREFERRED EMBODIMENTS

Referring now to the figures of the drawings in detail and first, particularly, to FIG. 1 thereof, there is shown a simple diagrammatic illustration, not to scale, of two identically constructed semiconductor chips A and B having external terminals and an exemplary number of bonding pads which differ in terms of their data input/data output organizational form and the wiring of the bonding pads. Two different types of bonding pads are illustrated: firstly bonding pads IOP for the exchange of input data and output data, and bonding pads for setting the data input/data output organizational form, referred to here as bonding option pads BOP. Each of the two chips has eight bonding pads IOP for the exchange of input data and output data. The chip A has a data input/data output organizational form designated here as DQ8, in which all eight bonding pads IOP 0 to 7 are used in a normal mode or normal operation of the chip. In other words, eight data bits are present in parallel. This organizational form is set by a fixed connection of selected bonding option pads BOP to a respective terminal for an external voltage potential. By way of example, the bonding option pads BOP 1 to 5 are "bonded" and have an external voltage potential applied to them (usually ground potential "GND"). The bonding option pad BOPi remains unwired.

The chip B has a data input/data output organizational form designated here as DQ4, in which only four of the eight bonding pads IOP 0 to 7 are used in a normal mode of the chip. In other words, four data bits are present in parallel. The unused bonding pads, in this case IOP 1, 2, 5, 6, are usually not "bonded". This organizational form is set for example by an unchanged external wiring of the bonding option pads BOP 1 to 5 and by a fixed connection of the bonding option pad BOPi to a terminal for an external voltage potential.

During a test, it is necessary to use, for the two semiconductor chips A and B, two different test programs which support the preset data input/data output organizational form of the respective chip. In addition, the test mode of the chip A and the test mode of the chip B have different test times. Since, given the same storage capacity, the chip A, on account of the larger data word width of eight bits, has a smaller address range than the chip B with its data word width of four bits, the time requirement in the test mode is higher in the case of chip B than in the case of chip A. For the reasons mentioned, it has been necessary to date to create and maintain a plurality of organization-specific test programs; moreover, comparatively long test times must be accepted depending on the organizational form.

Figure 2A:
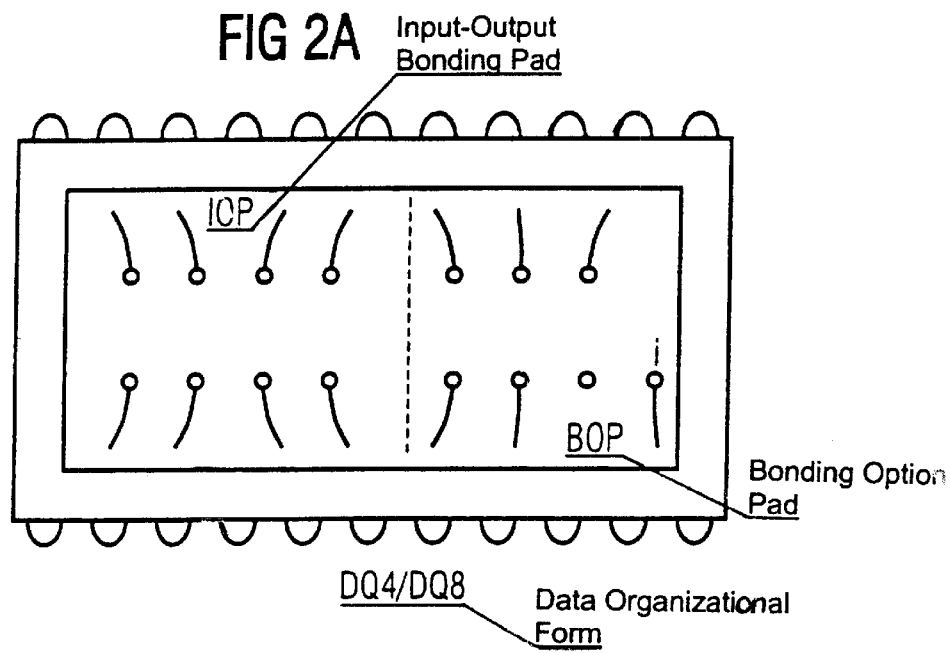
FIG. 2a is a diagrammatic top view of a semiconductor chip according to the invention having bonding pads and having a data input/data output organizational form that can be altered.

FIG. 2a shows a schematic illustration of a semiconductor chip according to the invention having bonding pads which can be altered in terms of its data input/data output organizational form. All of the bonding pads IOP are connected to external terminals and, the bonding option pad BOPi, in addition to the bonding option pads BOP 1 to 5, is wired up to an external voltage potential. As a consequence, the chip is operated in the normal mode in the DQ4 organizational form like the chip B in FIG. 1.

In order to reduce the test time in the test mode of the chip, the chip is changed over to an altered data input/data output organizational form during the test mode, without the external wiring of the bonding option pads BOP being altered. For the reasons mentioned above, a DQ8 organizational form as in the case of chip A from FIG. 1 is chosen here. With this chip, all of the bonding pads IOP 0 to 7 are used for the exchange of input and output data. That is to say that bonding pads IOP that are not used in the normal mode in the DQ4 organizational form are used in a test mode. In order to obtain an altered data input/data output organizational form, given an unaltered external wiring of the bonding option pads, the external wiring of the bonding option pad BOPi, by which the presetting of the data input/data output organizational form can be controlled through the use of external wiring, is canceled or suspended in terms of its efficacy or its effect by an internal interconnection or wiring. This internal interconnection or wiring of the bonding option pad BOPi is controlled for example by a control signal $\overline{TM}$ of a superordinate control device St for controlling the operating mode. That is to say that the control device St specifies, by a control signal $\overline{TM}$, whether the semiconductor chip is operated in the normal mode (DQ4 given $\overline{TM}$=1, external wiring is effective) or in the test mode (DQ8 given $\overline{TM}$=0, external wiring is not effective). Since the external wiring of the bonding option pads is not effective in the test mode, a test mode can be performed independently of the external voltage potential.

Figure 2B:
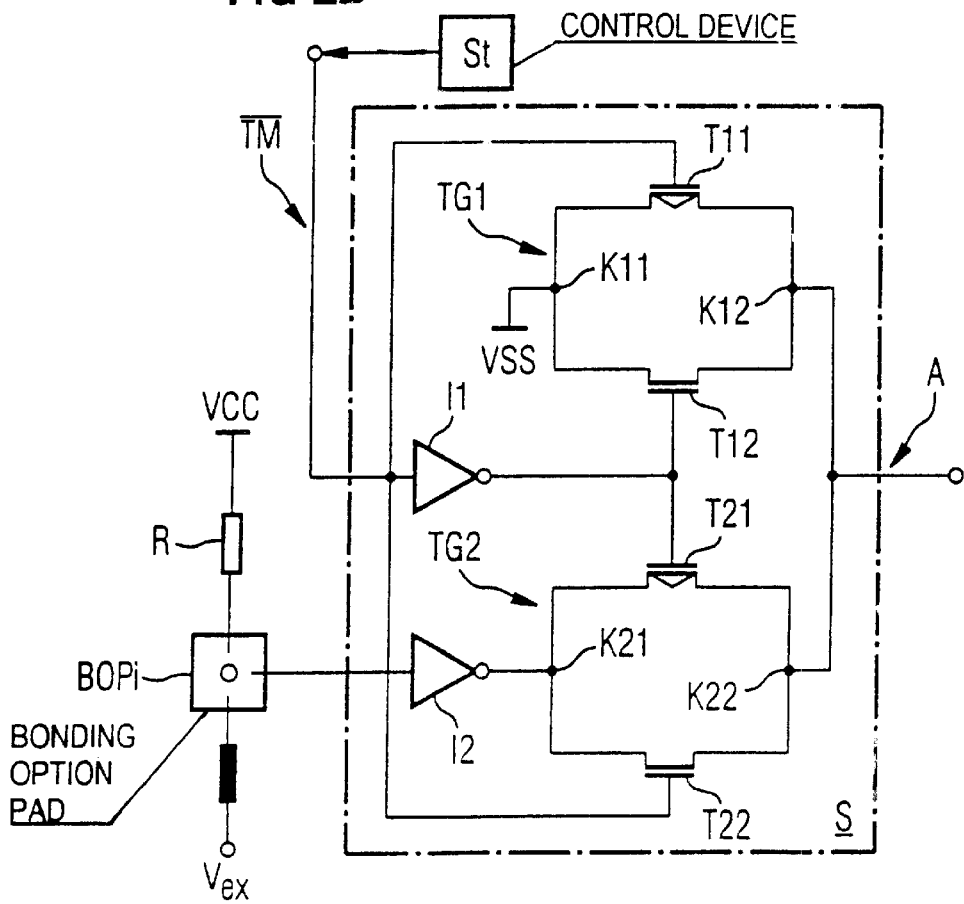
FIG. 2b is a schematic circuit diagram of a circuit for a bonding option pad, that allows a subsequent altering of a set data input/data output organizational form.

An exemplary embodiment is illustrated in FIG. 2b. The bonding option pad BOPi from FIG. 2a is wired up to a circuit S. The control signal $\overline{TM}$ of the superordinate controller of the operating mode St forms an input signal of the circuit S. The output signal A of the circuit S determines the data input/data output organizational form of the semiconductor chip with the states "log. 0" and "log. 1". The DQ8 organizational form is set given A="log. 0" ($\overline{TM}$=0), and the DQ4 organizational form is set given A="log. 1" ($\overline{TM}$=1). In this case, the state "log. 1" corresponds to a supply potential VCC, and the state "log. 0" corresponds to a reference-ground potential VSS. The external voltage potential Vex and the reference-ground potential VSS in this case assume the potential of a ground potential of the semiconductor module (VSS=Vex="GND"). The transmission gates TG1 and TG2 of the circuit S are activated alternately. If the bonding option pad BOPi is not wired up to the external voltage potential Vex, that is to say the bonding option pad BOPi is not "bonded", it assumes the supply potential VCC via the resistor R, which should be configured to have the highest possible resistance. The output signal A of the circuit S thus always assumes the state "log. 0".

The circuit S has two transmission gates TG1, TG2 each including two transistors T11, T12 and T21, T22, respectively, which are connected in parallel by their drain-source paths and are connected to one another at in each case two coupling nodes K11, 12 and K21, K22, respectively. The gate of the first transistor T11 of the first transmission gate TG1 and the gate of the second transistor T22 of the second transmission gate TG2 are connected to the terminal for the control signal $\overline{TM}$. The gate of the second transistor T12 of the first transmission gate TG1 and the gate of the first transistor T21 of the second transmission gate TG2 are connected to the terminal for the control signal $\overline{TM}$ via a first inverter I1. The first coupling node K11 of the transistors T11, T12 of the first transmission gate TG1 is connected to a reference-ground potential of the semiconductor chip VSS. The second coupling node K12 of the transistors T11, T12 of the first transmission gate TG1 forms the terminal for the output signal A, which serves for setting the data input/data output organizational form DQ4 and DQ8, respectively. The first coupling node K21 of the transistors T21, T22 of the second transmission gate TG2 is connected to the bonding option pad BOPi via a second inverter I2, and the second coupling node K22 of the transistors T21, T22 of the second transmission gate TG2 is connected to the terminal for the output signal A. The bonding option pad BOPi is connected to an external supply potential Vex and, via a resistor R, to an internal supply potential VCC of the semiconductor chip. The transistors T11, T12, T21, T22 of the transmission gates TG1, TG2 are advantageously field-effect transistors, the respective first transistor T11, T21 being of the p-channel type and the respective second transistor T12, T22 being of the n-channel type.

Since, as is evident from FIG. 2a, in contrast to chip B from FIG. 1, the bonding pads IOP 1, 2, 5, 6 are "bonded" and connected to external terminals, it must be ensured, by internal interconnecting or wiring of the affected bonding pads IOP, that in the normal mode no interfering voltage potentials or other interfering influences are coupled into the integrated circuits of the chip via the bonding pads IOP. This is generally achieved by switching devices at the input of the respective bonding pad IOP, which are switched to be inactive in the normal mode. An exemplary circuit for a bonding pad IOP is illustrated in FIG. 3, in which the switching devices are configured as driver stages. A driver 2 is connected to a data line D of the chip on its input side and to the bonding pad IOP on its output side. In the active state, the driver 2 performs the function of an output driver. A driver 1 is connected to the bonding pad IOP on its input side and to the data line D on its output side. In the active state, the driver 1 performs the function of a receiver and input driver. The two drivers are furthermore connected to supply potentials V1 and V2, respectively, and in each case to a ground terminal. The output signal A of the circuit S from FIG. 2b acts as a control signal of the circuit. The drivers 1 and 2 of the bonding pads IOP which are not used in the normal mode are inactive (A="log. 1") during the normal mode. In the test mode, the drivers 1 and 2 of these bonding pads and also of the remaining bonding pads IOP for the exchange of input data and output data are enabled (A="log. 0") for activation. Since the integrated circuits of the semiconductor chip are configured for different data input/data output organizational forms and only by subsequent "bonding" is the respective organizational form set, all of the bonding pads IOP are already provided with the driver stages mentioned.

Instead of using the bonding option pads BOP, the permanent setting of a data input/data output organizational form can also be effected for example through the use of laser fuses or other permanently programmable elements (for example chemically, mechanically, thermally programmable elements) which are severed prior to incorporation into a housing of a semiconductor module. Exemplary circuits are found e.g. in so-called redundancy decoders in integrated circuits of memory chips.

We claim:

1. An intergrated semiconductor chip configuration of the type having a semiconductor chip with a plurality of bonding pads for an exchange of input data and output data, said plurality of bonding pads including a first group of bonding pads being used for the exchange of input data output data in a selected normal mode selected from a plurality of normal modes and a second group of bonding pads not being used for the exchange of input data and output data in the selected normal mode, and a third group pf bonding pads with a least one bonding option pad for selecting a data input/data output organizational form out of a plurality of dasta input/data output organizational forms, wherein the improvement comprises:

said first group, said second group, and said third group of bonding pads being connected to respective external terminals; and said semiconductor chip being operable in a test mode and having an altered data input/data output organizational form during the test mode, causing said second group of bonding pads to be used in test mode for the exchange of input data and output data; and a number of bonding pads of said first group and a number of said second group being, respectively, variable without changing the respective internal and external interconnections, depending on said selection of the data input/data output organizational form.

2. The integrated semiconductor chip configuration according to claim 1, including two driver stages connected to one of said bonding pads of said second group, said driver stages being inactive during the normal mode and being enabled for an activation during the test mode.

3. The intergrated semiconductor chip configutation according to claim 1, wherein said number of boding pads of said first group and said number of said second group, respectively, is variable without changing said respective internal and external interconnections.

4. The intergrated semiconductor chip configuration according to claim 1, wherein said semiconductor chip is operated in the test mode using all bonding pads of said plurality except said at least one bonding option pad.

5. The intergrated semiconductor chip configuration according to claim 1, wherein said at least one bonding option pad has an external interconnection and is fixedly connected with a bonding wire to a respective terminal for an external voltage potential, and said semiconductor chip has the altered data input/data output organizational form during the test mode with said external interconnection being unchanged.

6. The integrated semiconductor chip configuration according to claim 5, wherein said at least one bonding option pad has an internal interconnection for setting the altered data input/data output organizational form, said internal interconnection canceling an efficacy of said external interconnection of said at least one bonding option pad to the respective terminal for the external voltage potential.

7. The integrated semiconductor chip configuration according to claim 6, including a control device for controlling operating modes, said control device generating a control signal for setting the altered data input/data output organizational form.

8. The integrated semiconductor chip configuration according to claim 6, including a circuit connected to said at least one bonding option pad, said circuit including:

a first transmission gate having a first field-effect transistor with a drain source path and a gate, having a second field-effect transistor with a drain source path and a gate, having a first coupling node and a second coupling node, said first field-effect transistor being connected to said second field-effect transistor at said first and said second coupling nodes with said drain source path of said first field-effect transistor being connected in parallel to said drain source path of said second field-effect transistor;

a second transmission gate having a third field-effect transistor with a drain source path and a gate, having a fourth field-effect transistor with a drain source path and a gate, having a third coupling node and a fourth coupling node, said third field-effect transistor being connected to said fourth field-effect transistor at said third and said fourth coupling nodes with said drain source path of said third field-effect transistor being connected in parallel to said drain source path of said fourth field-effect transistor, said first field-effect transistor having a complementary channel type with respect to said second field-effect transistor, said third field-effect transistor having a complementary channel type with respect to said fourth field-effect transistor, said first coupling node being connected to a reference-ground potential of said semiconductor chip, and said second coupling node forming an output terminal for an output signal for setting one of the plurality of data input/data output organizational forms, said fourth coupling node being connected to said output terminal;

an input terminal for receiving a control signal setting the altered data input/data output organizational form, said input terminal being connected to said gate of said first field-effect transistor and to said gate of said fourth field-effect transistor;

a first inverter connecting said gate of said second field-effect transistor and said gate of said third field-effect transistor to said input terminal for receiving the control signal;

a second inverter connecting said at least one bonding option pad to said third coupling node; and a resistor connected between said at least one bonding option pad and an internal supply potential of said semiconductor chip.

9. A method of controlling an integrated semiconductor chip, the method which comprises:

providing a plurality of bonding pads on a semiconductor chip for an exchange of input data and output data including a first group of bonding pads being used for the exchange of input data and output data in a selected normal mode selected from a plurality of normal modes and a second group of bonding pads not being used for the exchange of input data and output data in the selected normal mode;

providing a third group of bonding pads with a least one bonding option pad for selecting a data input/data output organizational form out of a plurality of data input/data output organizational forms;

presetting a data input/data output organizational form for a normal mode;

using only the first group of bonding pads for the exchange of input data and output data in the normal mode based on the preset data input/data output organizational form;

connecting the first group of bonding pads and the second group of bonding pads to external terminals; and selecting an altered data input/data output organizational form during a test mode, causing the second group of bonding pads to be used in the test mode for the exchange of input data and output data, a number of bonding pads of the first group and a number of the second group being, respectively, variable depending on the selection of the data input/data output organizational form.

10. The method according to claim 9, wherein the step of selecting an altered data input/data output organizational form requires no changing of the respective internal and external interconnections.

11. The method according to claim 9, wherein the step of selecting an altered data input/data output organizational form during the test mode results in the selection of all bonding pads of said plurality except the at least one bonding option pad.

12. The method according to claim 9, which comprises:

presetting the data input/data output organizational form for the normal mode by providing a fixed connection between the at least one bonding option pad and a respective terminal for an external voltage potential using a bonding wire; and setting the altered data input/data output organizational form during the test mode, without changing the fixed connection between the at least one bonding option pad and the respective terminal for the external voltage potential.

13. The method according to claim 12, which comprises:

setting the altered data input/data output organizational form by an internal interconnection of the bonding option pads, the altered data input/data output organizational form canceling an efficacy of the fixed connection between the at least one bonding option pad and the respective terminal for the external voltage potential.

14. The method according to claim 13, which comprises controlling the setting of the altered data input/data output organizational form with a control signal generated by a control device for controlling operating modes.

* * * * *